United States Patent
Furutani et al.

(10) Patent No.: US 10,182,518 B2
(45) Date of Patent: Jan. 15, 2019

(54) SHIELD CAP AND METHOD FOR MANUFACTURING THE SAME

(71) Applicant: IBIDEN CO., LTD., Ogaki (JP)

(72) Inventors: Toshiki Furutani, Ogaki (JP); Takema Adachi, Ogaki (JP); Hidetoshi Noguchi, Ogaki (JP); Shota Tachibana, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/783,330

(22) Filed: Oct. 13, 2017

(65) Prior Publication Data

US 2018/0110164 A1  Apr. 19, 2018

(30) Foreign Application Priority Data

Oct. 13, 2016  (JP) .................................. 2016-201845

(51) Int. Cl.
*H05K 9/00* (2006.01)
*H05K 13/00* (2006.01)

(52) U.S. Cl.
CPC .......... *H05K 9/0086* (2013.01); *H05K 9/003* (2013.01); *H05K 9/0084* (2013.01); *H05K 9/0088* (2013.01); *H05K 13/0084* (2013.01); *H05K 2201/0338* (2013.01); *H05K 2201/0707* (2013.01)

(58) Field of Classification Search
CPC ............................. H05K 9/0084; H05K 9/003
See application file for complete search history.

(56) References Cited

U.S. PATENT DOCUMENTS

2013/0242487 A1* 9/2013 Fujioka ............. B29C 45/14221
361/679.01

FOREIGN PATENT DOCUMENTS

JP  2002-237542 A  8/2002

* cited by examiner

*Primary Examiner* — Hung V Ngo
(74) *Attorney, Agent, or Firm* — Oblon, McClelland, Maier & Neustadt, L.L.P.

(57) ABSTRACT

A shield cap for protecting an electronic component includes a cap member having a ceiling portion, a side wall portion and a partition wall portion, and a conductive film formed on the cap member such that the conductive film is formed to shield electromagnetic waves. The cap member is formed such that the ceiling portion has an inner region and an outer region surrounding the inner region, the side wall portion is supporting the outer region, and the partition wall portion is supporting the inner region, the ceiling portion has a first surface facing the side wall portion and the partition portion and a second surface on the opposite side and includes a reinforcing material positioned between the first and second surfaces, and the cap member is formed such that the side wall, ceiling and partition wall portions are forming multiple accommodation spaces to accommodate multiple electronic components.

20 Claims, 12 Drawing Sheets

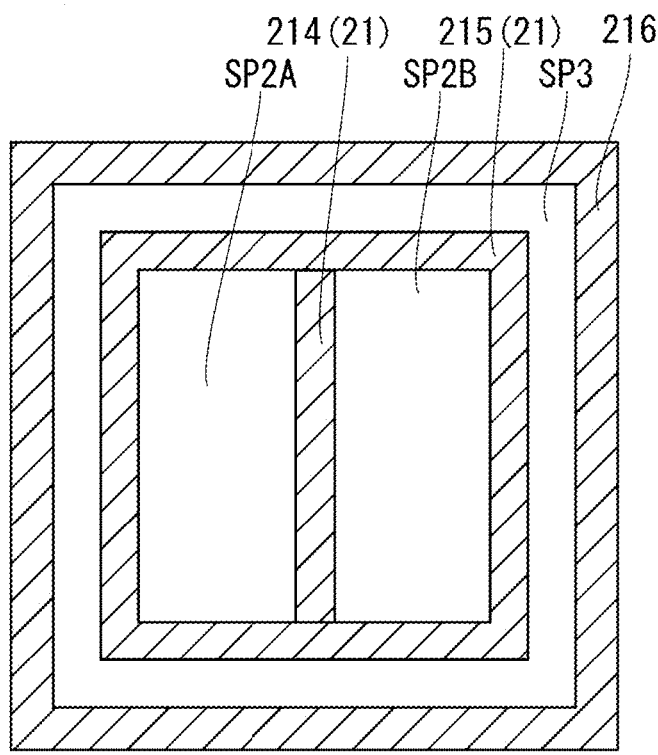
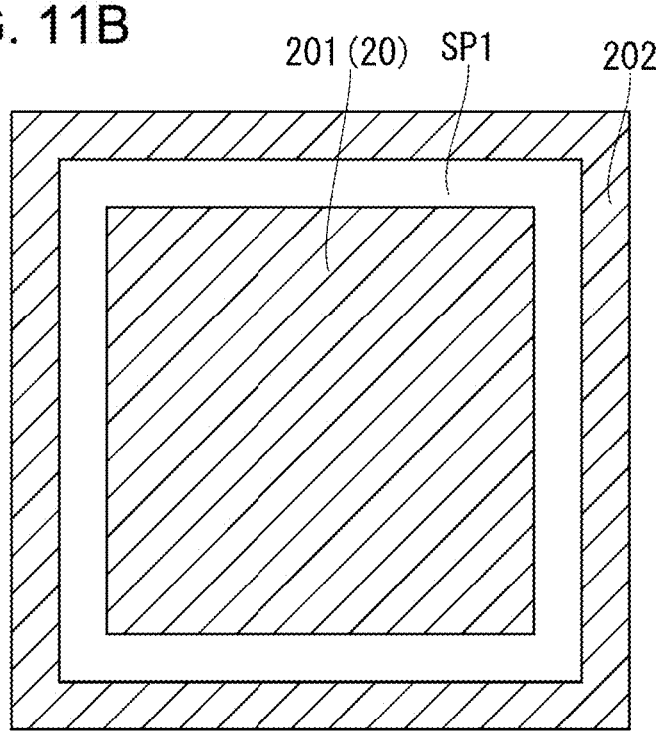

SHIELD CAP AND METHOD FOR MANUFACTURING THE SAME

CROSS-REFERENCE TO RELATED APPLICATIONS

The present application is based upon and claims the benefit of priority to Japanese Patent Application No. 2016-201845, filed Oct. 13, 2016, the entire contents of which are incorporated herein by reference.

BACKGROUND OF THE INVENTION

Field of the Invention

The present invention relates to shield cap that protects an electronic component on a substrate.

Description of Background Art

Japanese Patent Laid-Open Publication No. 2002-237542 describes a metal cap that includes a metal foil tape and polyamide imide coated on the metal foil tape. The entire contents of this publication are incorporated herein by reference.

SUMMARY OF THE INVENTION

According to one aspect of the present invention, a shield cap for protecting an electronic component includes a cap member having a ceiling portion, a side wall portion and a partition wall portion, and a conductive film formed on the cap member such that the conductive film is formed to shield electromagnetic waves. The cap member is formed such that the ceiling portion has an inner region and an outer region surrounding the inner region, the side wall portion is supporting the outer region of the ceiling portion, and the partition wall portion is supporting the inner region of the ceiling portion, the ceiling portion has a first surface facing the side wall portion and the partition portion and a second surface on the opposite side with respect to the first surface and includes a reinforcing material positioned between the first surface and the second surface, and the cap member is formed such that the side wall portion, the ceiling portion and the partition wall portion are forming multiple accommodation spaces to accommodate multiple electronic components respectively.

According to another aspect of the present invention, a method for manufacturing a shield cap for protecting an electronic component includes preparing a first prepreg for forming a ceiling portion having a first surface, preparing a second prepreg for forming a side wall portion and a partition wall portion each having a third surface, laminating the first prepreg onto the second prepreg such that a laminate including the first prepreg and the second prepreg is formed to have the first surface of the first prepreg and the third surface of the second prepreg face each other, forming multiple accommodation spaces for accommodating multiple electronic components respectively in the laminate such that a cap member including the ceiling portion, the side wall portion and the partition wall portion is formed, and forming a conductive film on the cap member such that the conductive film is formed to shield electromagnetic waves. The cap member is formed such that the ceiling portion has an inner region and an outer region surrounding the inner region, the side wall portion is supporting the outer region of the ceiling portion, and the partition wall portion is supporting the inner region of the ceiling portion, and the ceiling portion has a first surface facing the side wall portion and the partition portion and a second surface on the opposite side with respect to the first surface and includes a reinforcing material positioned between the first surface and the second surface, and the cap member is formed such that the side wall portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 11A and 11B are plan views of conductor parts; and

DETAILED DESCRIPTION OF THE EMBODIMENTS

Figure 1A:
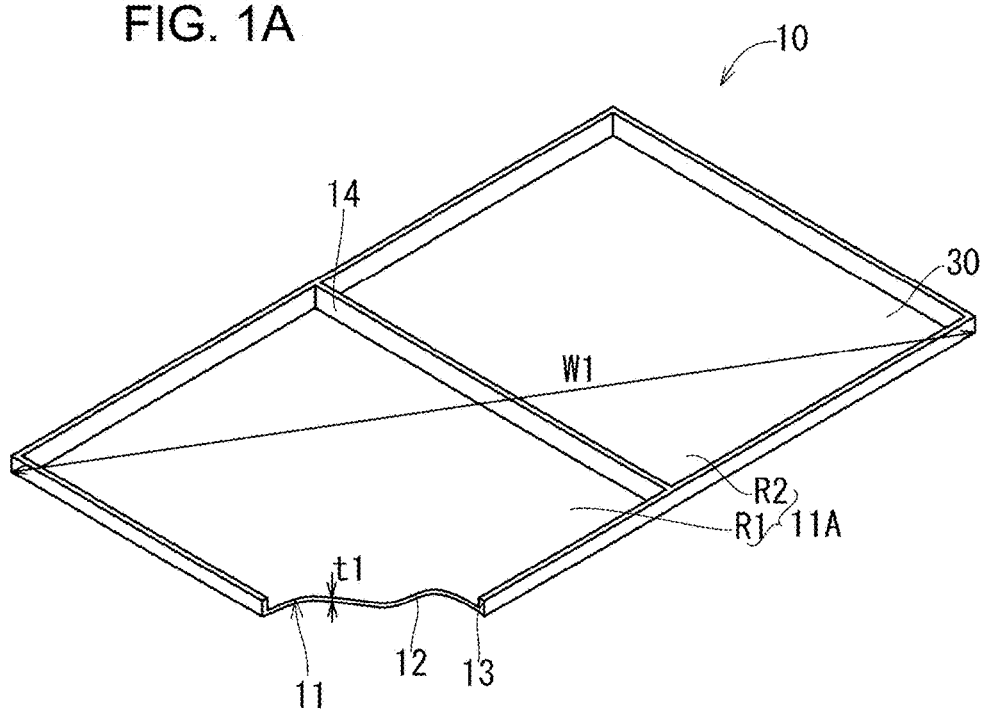
FIG. 1A is a perspective view of a shield cap according to a first embodiment of the present invention.

Embodiments will now be described with reference to the accompanying drawings, wherein like reference numerals designate corresponding or identical elements throughout the various drawings.

First Embodiment

Figure 1B:
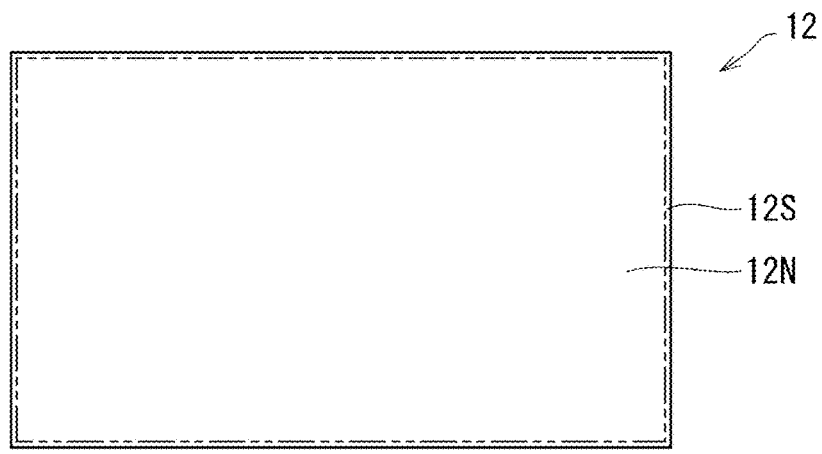
FIG. 1B is a plan view of a ceiling part.
Figure 2:
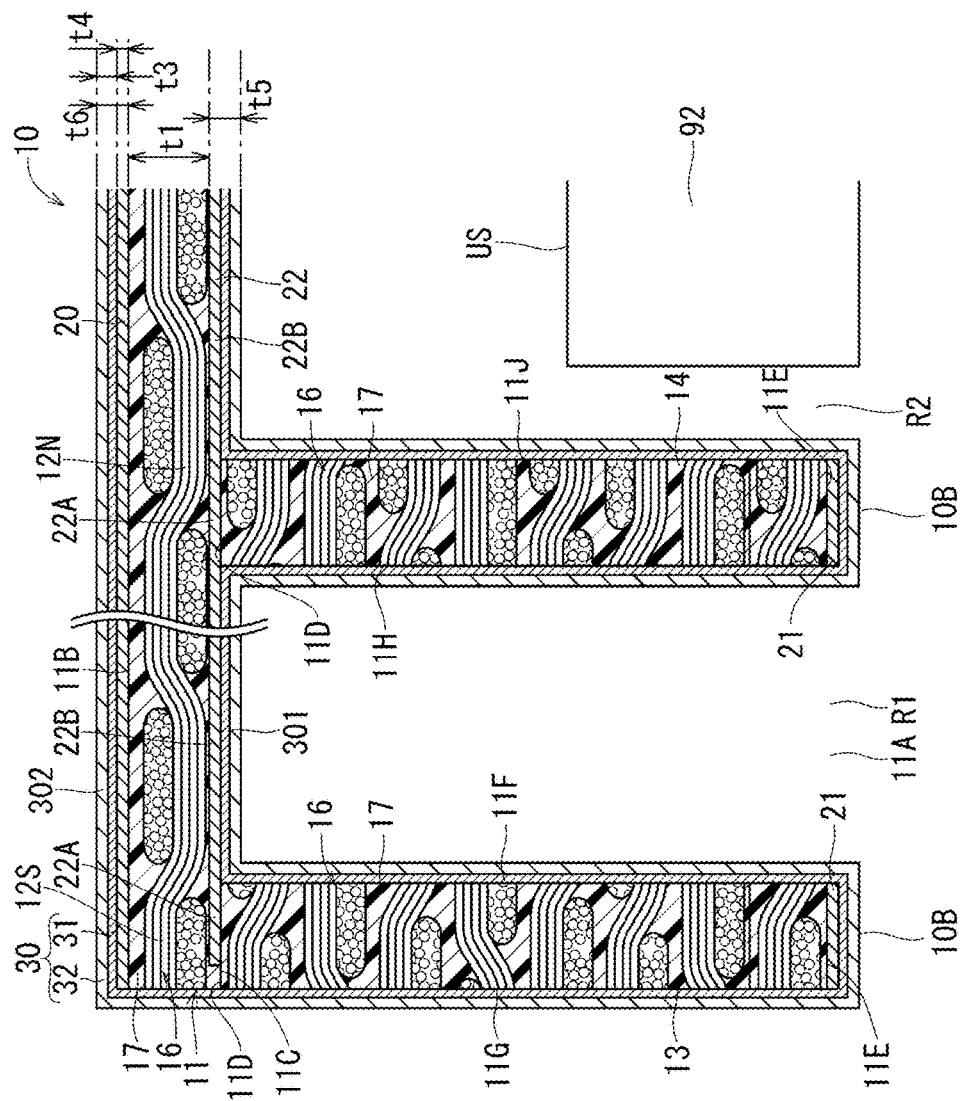
FIG. 2 is an enlarged cross-sectional view of the shield cap.

As illustrated in FIG. 1A, a shield cap 10 of a first embodiment includes a cap member 11, and a conductive film 30 that is formed on the cap member 11. The cap member 11 includes a ceiling part 12, a side wall part 13, and a partition wall 14. The cap member 11 is a case for protecting an electronic component such as an IC chip. Therefore, the cap member 11 has a space (11A) for accommodating an electronic component. The side wall part 13 surrounds the space (11A), and the ceiling part 12 covers the space (11A). In FIG. 1, the side wall part 13 completely surrounds the space (11A), and the ceiling part 12 completely covers the space (11A). The partition wall 14 divides the space (11A) into a first space (R1) and a second space (R2). The spaces (R1, R2) are formed by the ceiling part 12, the side wall part 13, and the partition wall 14. As illustrated in FIG. 2, an electronic component 92 is accommodated in at least one of the first space (R1) and the second space (R2). The electronic component 92 can be accommodated in all of the spaces (R1, R2).

As illustrated in FIG. 2, the ceiling part 12 has a first surface (11C) and a second surface (11B), the first surface (11C) facing the spaces (11A, R1, R2) and an upper surface (US) of the electronic component 92. The second surface (11B) is a surface on an opposite side of the first surface (11C). The first surface (11C) and the second surface (11B) are formed substantially parallel to each other. Further, as illustrated in FIG. 1B, the ceiling part 12 has an inner region (12N) and an outer region (12S). The outer region (12S) surrounds the inner region (12N).

The side wall part 13 has a third surface (11D) facing the first surface (11C), and a fourth surface (11E) that is on an opposite side of the third surface (11D). The side wall part 13 has a fifth surface (11F) and a sixth surface (11G), which is on an opposite side of the fifth surface (11F), between the third surface (11D) and the fourth surface (11E). The fifth surface (11F) faces the space (11A). The first surface (11C) and the third surface (11D) have a substantially parallel relationship. The side wall part 13 is formed below the first surface (11C) of the ceiling part 12. Further, the side wall part 13 supports the outer region (12S) of the ceiling part 12. The side wall part 13 is connected to an outer periphery of the ceiling part 12.

The partition wall 14 has a third surface (11D) facing the first surface (11C), and a fourth surface (11E) that is on an opposite side of the third surface (11D). The partition wall 14 has a seventh surface (11H) and an eighth surface (11J), which is on an opposite side of the seventh surface (11H), between the third surface (11D) and the fourth surface (11E). The seventh surface (11H) faces the first space (R1), and the eighth surface (11J) faces the second space (R2). The first surface (11C) and the third surface (11D) have a substantially parallel relationship. The partition wall 14 is formed below the first surface (11C) of the ceiling part 12. Further, the partition wall 14 supports the inner region (12N) of the ceiling part 12. The partition wall 14 connects between opposing fifth surfaces (11F, 11F) of the side wall part 13. As a result, the partition wall 14 separates the space (11A) into the first space (R1) and the second space (R2).

The ceiling part 12 has a thickness (t1). For example, the thickness (t1) is 50 µm or more and 300 µm or less.

As illustrated in FIG. 2, the ceiling part 12 is formed of a resin 17 and a reinforcing material 16. The ceiling part 12 has the reinforcing material 16 between the first surface (11C) and the second surface (11B). Since the ceiling part 12 has the reinforcing material 16, the ceiling part 12 has high strength. Therefore, deformation of the ceiling part 12 can be suppressed.

The resin 17 of the ceiling part 12 is, for example, epoxy. Examples of resins other than epoxy include polyimide and phenol. Examples of the reinforcing material 16 of the ceiling part 12 include a glass cloth, glass fiber and aramid fiber. A glass cloth is preferred.

In FIG. 2, the reinforcing material 16 is one sheet of a glass cloth. However, it is also possible that the ceiling part 12 has multiple sheets of glass cloths. When one sheet of the reinforcing material 16 is provided, the reinforcing material 16 is formed at a center in a thickness direction of the ceiling part 12.

Figure 3:
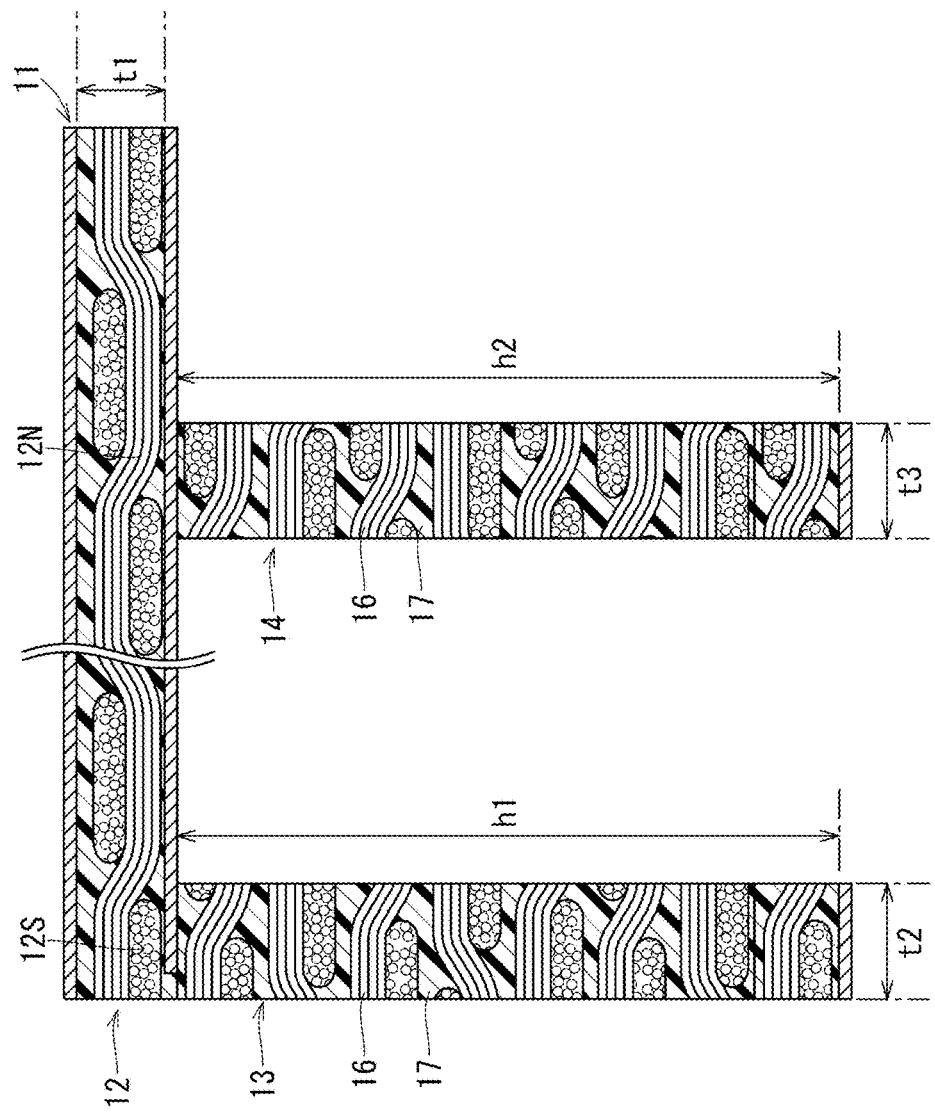
FIG. 3 is an enlarged cross-sectional view of a cap member.

As illustrated in FIG. 3, the side wall part 13 has a thickness (t2). The thickness (t2) of the side wall part 13 is substantially the same as the thickness (t1) of the ceiling part 12. Further, the thickness (t2) of the side wall part 13 is ⅕ or less times a height (h1) (distance between the third surface (11D) and the fourth surface (11E)) of the side wall part 13.

Similar to the ceiling part 12, the side wall part 13 is formed of a resin 17 and a reinforcing material 16. Examples of the resin 17 of the side wall part 13 are the same as the examples of the resin 17 of the ceiling part 12. Examples of the reinforcing material 16 of the side wall part 13 are the same as the examples of the reinforcing material 16 of the ceiling part 12. It is also possible that the resin 17 of the side wall part 13 is different from the resin 17 of the ceiling part 12. It is also possible that the reinforcing material 16 of the side wall part 13 is different from the reinforcing material 16 of the ceiling part 12.

As illustrated in FIG. 3, the partition wall 14 has a thickness (t3). In FIG. 3, the thickness (t3) is substantially the same as the thickness (t1) of the ceiling part 12. Further, the thickness (t3) is substantially the same as the thickness (t2) of the side wall part 13. A height (h2) (distance between the third surface (11D) and the fourth surface (11E)) of the partition wall 14 is substantially the same as the height (h1) of the side wall part 13.

As illustrated in FIG. 2, the partition wall 14 has the same structure as the side wall part 13, and is formed of the resin 17 and the reinforcing material 16.

The conductive film 30 is preferably formed on the second surface (11B) and the sixth surface (11G), which are facing outward, among the surfaces (11B, 11C, 11D, 11E, 11F, 11G, 11H, 11J) of the cap member 11. Further, the conductive film 30 is preferably formed on at least one of the seventh surface (11H) and the eighth surface (11J) of the partition wall 14. It is also possible that the conductive film 30 is formed on both of the seventh surface (11H) and the eighth surface (11J). The conductive film 30 is formed by plating, and the conductive film 30 on the second surface (11B) and the conductive film 30 on the sixth surface (11G) are preferably simultaneously formed. The conductive film 30 may be further formed on the first surface (11C) and the fifth surface (11F), which face the space (11A). Further, the conductive film 30 may be formed on the fourth surface (11E). It is preferable that the conductive film 30 completely cover the surfaces (11B, 11C, 11E, 11F, 11G, 11H, 11J). In this case, the conductive film 30 is simultaneously formed on the surfaces (11B, 11C, 11E, 11F, 11G, 11H, 11J). By forming the conductive film 30, a shielding effect of the electronic component 92 accommodated in the shield cap 10 can be increased. The conductive film 30 may have an opening.

A second metal layer 20 can be formed on the second surface (11B) of the ceiling part 12. Substantially the entire second surface (11B) is covered by the second metal layer 20. For example, the second metal layer 20 is formed from a second metal foil. The conductive film 30 is formed on the second metal layer 20. The second metal layer 20 is sandwiched by the second surface (11B) and the conductive film 30.

A third metal layer 21 can be formed on the fourth surface (11E) of the side wall part 13 and the partition wall 14. Substantially the entire fourth surface (11E) is covered by the third metal layer 21. For example, the third metal layer 21 is formed from a third metal foil. The conductive film 30 is formed on the third metal layer 21. The third metal layer 21 is sandwiched by the fourth surface (11E) and the conductive film 30.

A first metal layer 22 is formed on a portion of the first surface (11C) of the ceiling part 12, the portion covering the space (11A). For example, the first metal layer 22 is formed from a first metal foil. The first metal layer 22 may extend to between the first surface (11C) of the ceiling part 12 and the third surface (11D) of the side wall part 13. In FIG. 2, the first metal layer 22 completely covers the third surface (11D) of the partition wall 14. The first metal layer 22 is formed by a portion (first portion (22A) of the first metal layer 22) sandwiched by the first surface (11C) and the third surface (11D) and a portion (second portion (22B) of the first metal layer 22) formed on the first surface (11C) above the first space (R1) and the second space (R2). The first portion (22A) of the first metal layer 22 and the second portion (22B) of the first metal layer 22 are continuous. It is preferable that the first metal layer 22 partially cover the third surface (11D) of the side wall part 13. This allows the first surface (11C) of the ceiling part 12 and the third surface (11D) of the side wall part 13 to be bonded to each other via the resin 17 of the ceiling part 12 and the resin 17 of the side wall part 13. As a result, the ceiling part 12 and the side wall part 13 are strongly bonded to each other. Further, it is preferable that the first metal layer 22 partially cover the third surface (11D) of the partition wall 14. In this case, the first surface (11C) of the ceiling part 12 and the third surface (11D) of the partition wall 14 are bonded to each other via the resin 17 of the ceiling part 12 and the resin 17 of the partition wall 14. As a result, the ceiling part 12 and the partition wall 14 are strongly bonded to each other. The first metal layer 22 is sandwiched by the first surface (11C) and the conductive film 30. The first portion (22A) of the first metal layer 22 may completely cover the third surface (11D) of the side wall part 13. The first portion (22A) of the first metal layer 22 may completely cover the third surface (11D) of the partition wall 14. Examples of the metal foils for forming the metal layers (20, 21, 22) include a copper foil, a nickel foil, and an aluminum foil. A copper foil is preferred.

When the conductive film 30 is formed on the fifth surface (11F), the conductive film 30 is formed directly on the fifth surface (11F). When the conductive film 30 is formed on the sixth surface (11G), the conductive film 30 is formed directly on the sixth surface (11G). When the conductive film 30 is formed on the seventh surface (11H), the conductive film 30 is formed directly on the seventh surface (11H). When the conductive film 30 is formed on the eighth surface (11J), the conductive film 30 is formed directly on the eighth surface (11J). The conductive film 30 is formed by an electroless plating film 31 and an electrolytic plating film 32 on the electroless plating film 31. The electroless plating film 31 and the electrolytic plating film 32 are each formed, for example, from a copper plating film. It is also possible that the conductive film 30 is formed by the electroless plating film 31 only.

When the third metal layer 21 is projected on the second surface (11B) with light perpendicular to the second surface (11B), the third metal layer 21 on the fourth surface (11E) of the side wall part 13 has a frame shape. The third metal layer 21 on the fourth surface (11E) of the partition wall 14 has, for example, a rectangular shape. When the first metal layer 22 is projected on the second surface (11B) with light perpendicular to the second surface (11B), the first metal layer 22 has, for example, a quadrangular shape.

As illustrated in FIG. 2, the conductive film 30 has a thickness (t3). The metal layers (20, 21, 22) each have a thickness (t4). The metal layers (20, 21, 22) may have different thicknesses. A sum of the thickness (t3) of the conductive film 30 formed on the first surface (11C) of the ceiling part 12 and the thickness (t4) of the first metal layer 22 is a thickness (t5). A sum of the thickness (t3) of the conductive film 30 formed on the second surface (11B) of the ceiling part 12 and the thickness (t4) of the second metal layer 20 is a thickness (t6). A sum of the thickness (t5) and the thickness (t6) is a sum (t7). The sum (t7) is smaller than the thickness (t1) of the ceiling part 12. By reducing the sum (t7), a height of the shield cap 10 can be reduced. A ratio (t7/t1) of the sum (t7) to the thickness (t1) is preferably 0.05 or more and 0.4 or less. A specific gravity of the ceiling part 12 is reduced. The weight of the ceiling part 12 is reduced. Deflection of the ceiling part 12 can be suppressed. The thickness (t1) is a distance between the conductors sandwiching the ceiling part 12. In FIG. 2, the thickness (t1) is a distance between the first metal layer 22 and the second metal layer 20.

Figure 4:
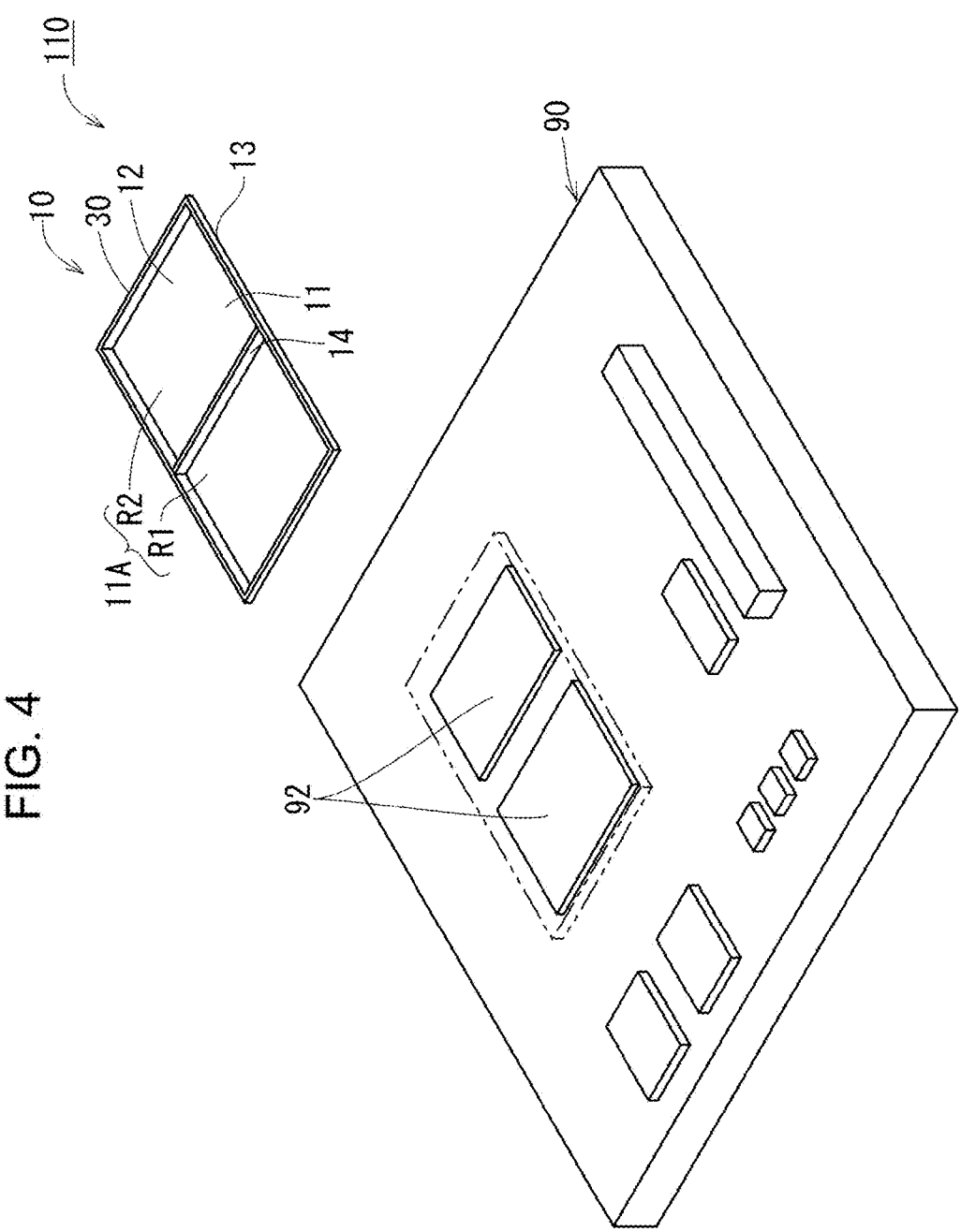
FIG. 4 illustrates an application example of the shield cap.

FIG. 4 illustrates an application example 110 of the shield cap 10 of the first embodiment. The application example 110 includes a printed wiring board 90, electronic components (92, 92) such as semiconductor chips mounted on the printed wiring board 90, and the shield cap 10 of the first embodiment protecting the electronic components (92, 92). Examples of the electronic components 92 include a CPU and a memory. The shield cap 10 is fixed to the printed wiring board 90 such that the electronic components (92, 92) are accommodated in the spaces (R1, R2). The fourth surface (11E) of the side wall part 13 is fixed to the printed wiring board 90 with an adhesive. Further, the fourth surface (11E) of the partition wall 14 is fixed to the printed wiring board 90 with an adhesive. Examples of the adhesives include solder, a resin adhesive, and a conductive paste.

As illustrated in FIG. 2, the shield cap 10 of the first embodiment has a first conductive film 301 (the conductive film 30 formed on the first surface (11C), the fifth surface (11F), the seventh surface (11H), and the eighth surface (11J)) and a second conductive film 302 (the conductive film 30 formed on the second surface (11B) and the sixth surface (11G)). Thereby, the electronic components 92 are doubly covered. A high shielding effect is expected. Further, by forming the first metal layer 22 on the first surface (11C) of the ceiling part 12, the shielding effect can be further improved. The electronic component 92 in the shield cap 10 is likely to be greatly affected by electromagnetic waves reaching the ceiling part 12. For example, the second metal layer 20 and the conductive film 30 are formed on the second surface (11B) of the ceiling part 12. As a result, the thickness (t6) of the layers formed of a conductive material is increased. Therefore, an amount of electromagnetic waves passing through the ceiling part 12 can be reduced. Further, heat dissipation performance is also increased.

The first conductive film 301 and the second conductive film 302 are connected to each other by the conductive film 30 on the fourth surface (11E) of the side wall part 13, or by the third metal layer 21. It is also possible that the first conductive film 301 and the second conductive film 302 are connected to each other both by the conductive film 30 on the fourth surface (11E) of the side wall part 13 and by the third metal layer 21. Therefore, shielding performance and heat dissipation performance are improved.

The third metal layer 21 is formed from a metal foil. When the third metal layer 21 is formed from a metal foil on the fourth surface (11E) of the cap member 11, flatness of a surface (10B) (lower surface of the shield cap 10) bonded to the printed wiring board 90 can be increased. As a result, a gap is unlikely to be formed between the printed wiring board 90 and the lower surface (10B) of the shield cap 10. The lower surface (10B) is illustrated in FIG. 2. Further, when the shield cap 10 is fixed to the printed wiring board using solder, the conductive film 30 on the fourth surface (11E) may diffuse into the solder. However, when the third metal layer 21 is present on the fourth surface (11E), the shield cap 10 can be reliably fixed to the printed wiring board 90 using solder.

The shield cap 10 has the partition wall 14. Therefore, even when multiple electronic components (92, 92) are accommodated in one shield cap 10, interference between the electronic components (92, 92) can be prevented. In this case, when the conductive film 30 is formed on both the seventh surface (11H) and the eighth surface (11J), the shielding effect can be increased. In the first embodiment, due to the partition wall 14, the space (11A) is completely divided into the first space (R1) and the second space (R2). Therefore, the shielding effect can be increased. The shield cap 10 has the partition wall 14. Therefore, the ceiling part 12 of the shield cap 10 is supported by the side wall part 13 and the partition wall 14. As a result, deflection of the ceiling part 12 can be suppressed. Further, the partition wall 14 of the first embodiment is formed in a substantially central portion of the ceiling part 12. A deformation amount of the ceiling part 12 is likely to be the largest in the central portion. In the first embodiment, the central portion is supported by the partition wall 14. The deformation amount of the entire ceiling part 12 can be reduced.

Further, since the ceiling part 12, the side wall part 13 and the partition wall 14 have the reinforcing material 16, the ceiling part 12, the side wall part 13 and the partition wall 14 have high strength. As a result, deflection of the ceiling part 12 can be suppressed.

An example of a method for manufacturing the shield cap 10 of the first embodiment is illustrated below.

Figure 5:
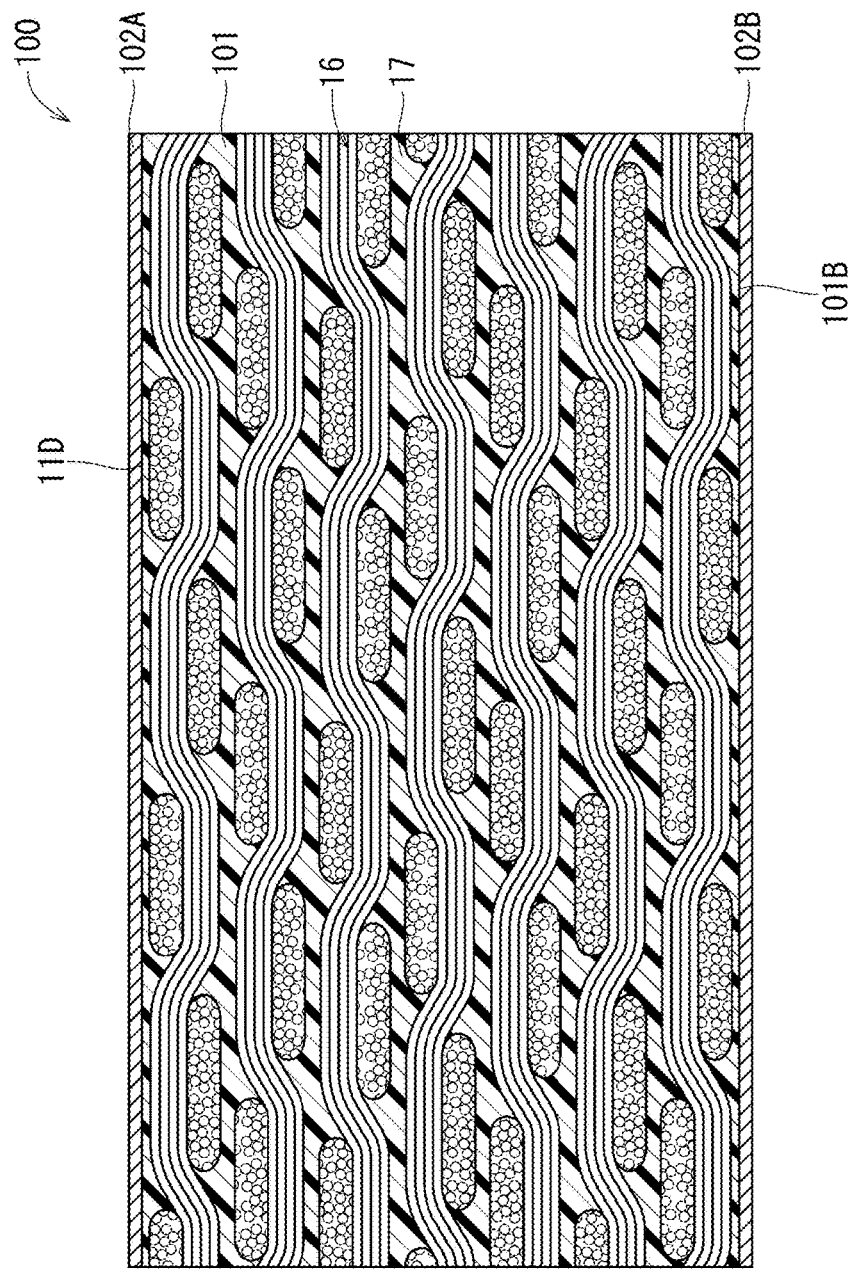
FIG. 5 is a cross-sectional view illustrating a manufacturing process of the shield cap.

(1) As illustrated in FIG. 5, a double-sided copper-clad laminated plate 100 is prepared. The double-sided copper-clad laminated plate 100 has a first insulating layer 101, and a copper foil (102A) (as a first metal foil) and a copper foil (102B) that sandwich the first insulating layer 101. The first insulating layer 101 has the third surface (11D) and a ninth surface (101B) that is on an opposite side of the third surface (11D). The copper foil (102A) is laminated on the third surface (11D) of the first insulating layer 101. The copper foil (102B) is laminated on the ninth surface (101B) of the first insulating layer 101. The first insulating layer 101 is formed of multiple sheets of the reinforcing material 16 and the resin 17. The first insulating layer 101 is formed from a second prepreg.

Figure 6:
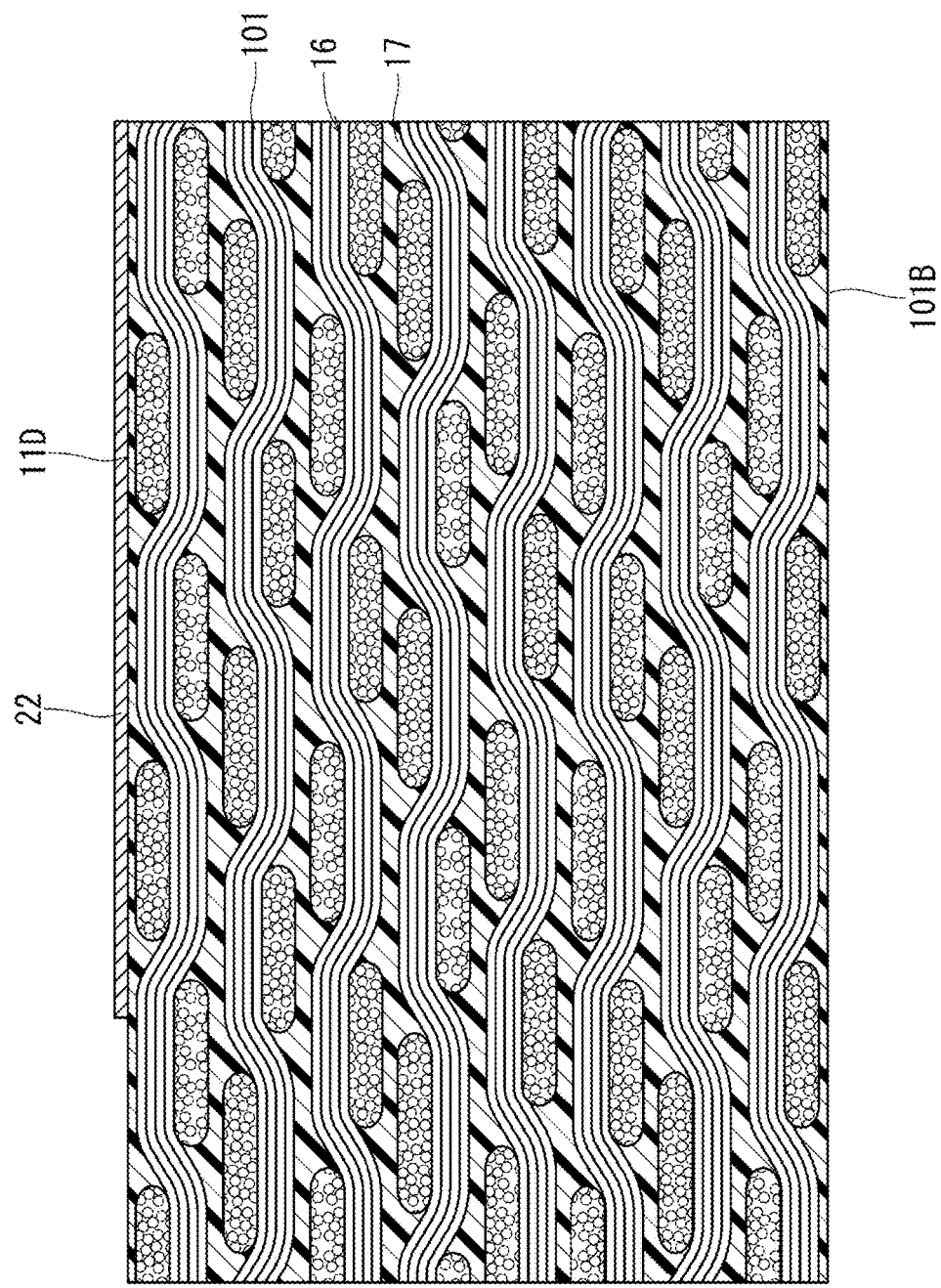
FIG. 6 is a cross-sectional view illustrating a manufacturing process of the shield cap.

(2) Next, as illustrated in FIG. 6, the first metal layer 22 is formed on the third surface (11D) from the copper foil (102A) using a subtractive method. Further, the copper foil (102B) is completely removed.

Figure 7:
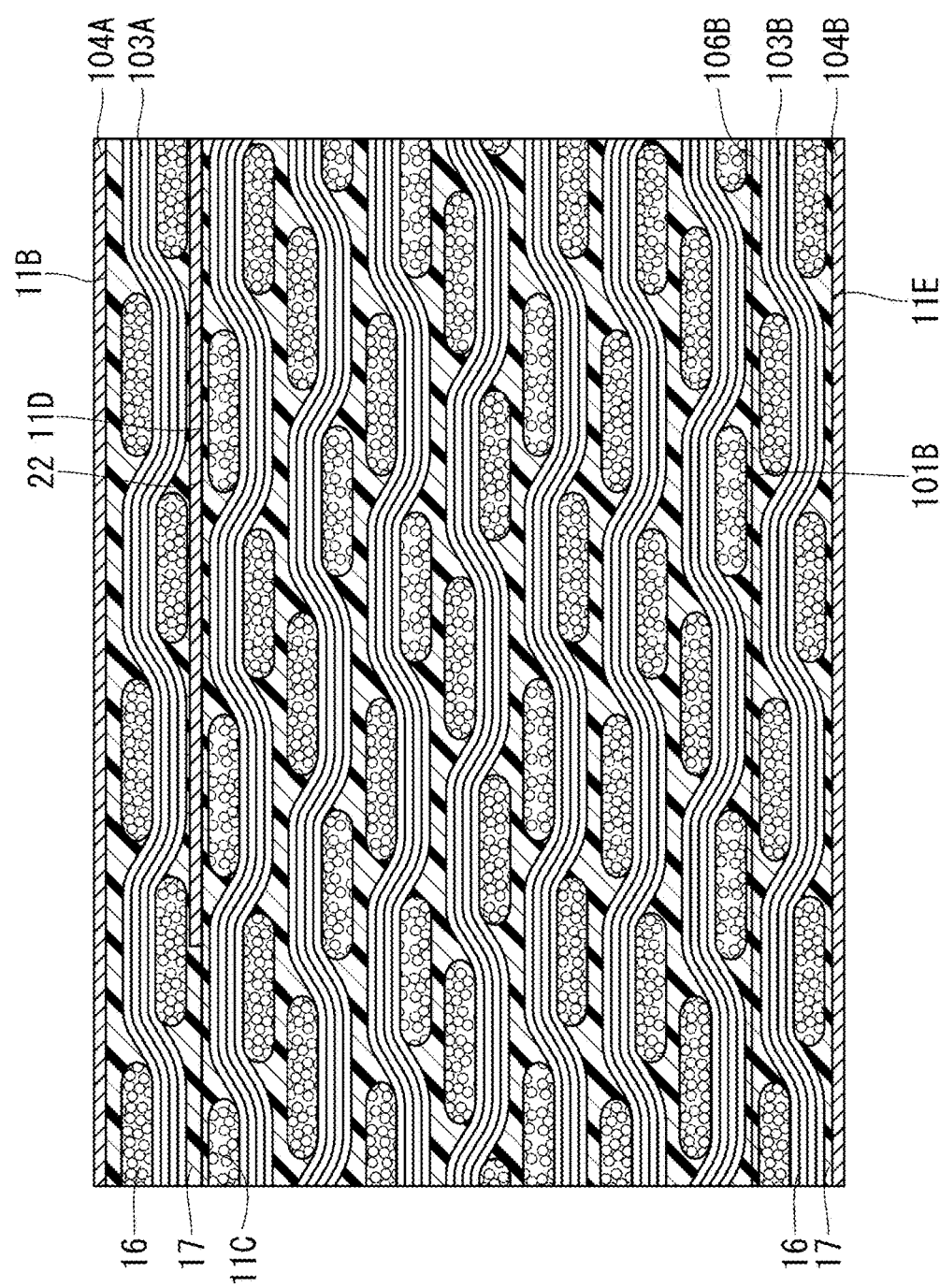
FIG. 7 is a cross-sectional view illustrating a manufacturing process of the shield cap.

(3) Next, as illustrated in FIG. 7, a first prepreg is laminated on the third surface (11D) and the first metal layer 22. Further, a copper foil (104A) as the second metal foil is laminated on the first prepreg. A third prepreg is laminated on the ninth surface (101B). Further, a copper foil (104B) as the third metal foil is laminated on the third prepreg. Thereafter, by hot pressing, a second insulating layer (103A) having the second surface (11B) and the first surface (11C) that is on an opposite side of the second surface (11B) is formed from the first prepreg on the third surface (11D). The first surface (11C) and the third surface (11D) face each other. A third insulating layer (103B) having a tenth surface (106B) and the fourth surface (11E) that is on an opposite side of the tenth surface (106B) is formed from the third prepreg on the ninth surface (101B). The tenth surface (106B) and the ninth surface (101B) face each other. As a result, the second insulating layer (103A) and the copper foil (104A) are sequentially formed on the third surface (11D) and the first metal layer 22. The third insulating layer (103B) and the copper foil (104B) are sequentially formed on the ninth surface (101B). A laminate formed by the first insulating layer 101, the second insulating layer (103A), the third insulating layer (103B), the first metal layer 22, and the copper foils (104A, 104B) is obtained. The third insulating layer (103B) is not essential. When the third insulating layer (103B) is not provided, the ninth surface (101B) is the fourth surface (11E). Then, the copper foil (104B) is directly formed on the fourth surface (11E). The second insulating layer (103A) and the third insulating layer (103B) are each formed of one sheet of the reinforcing material 16 and the resin 17.

Figure 8:
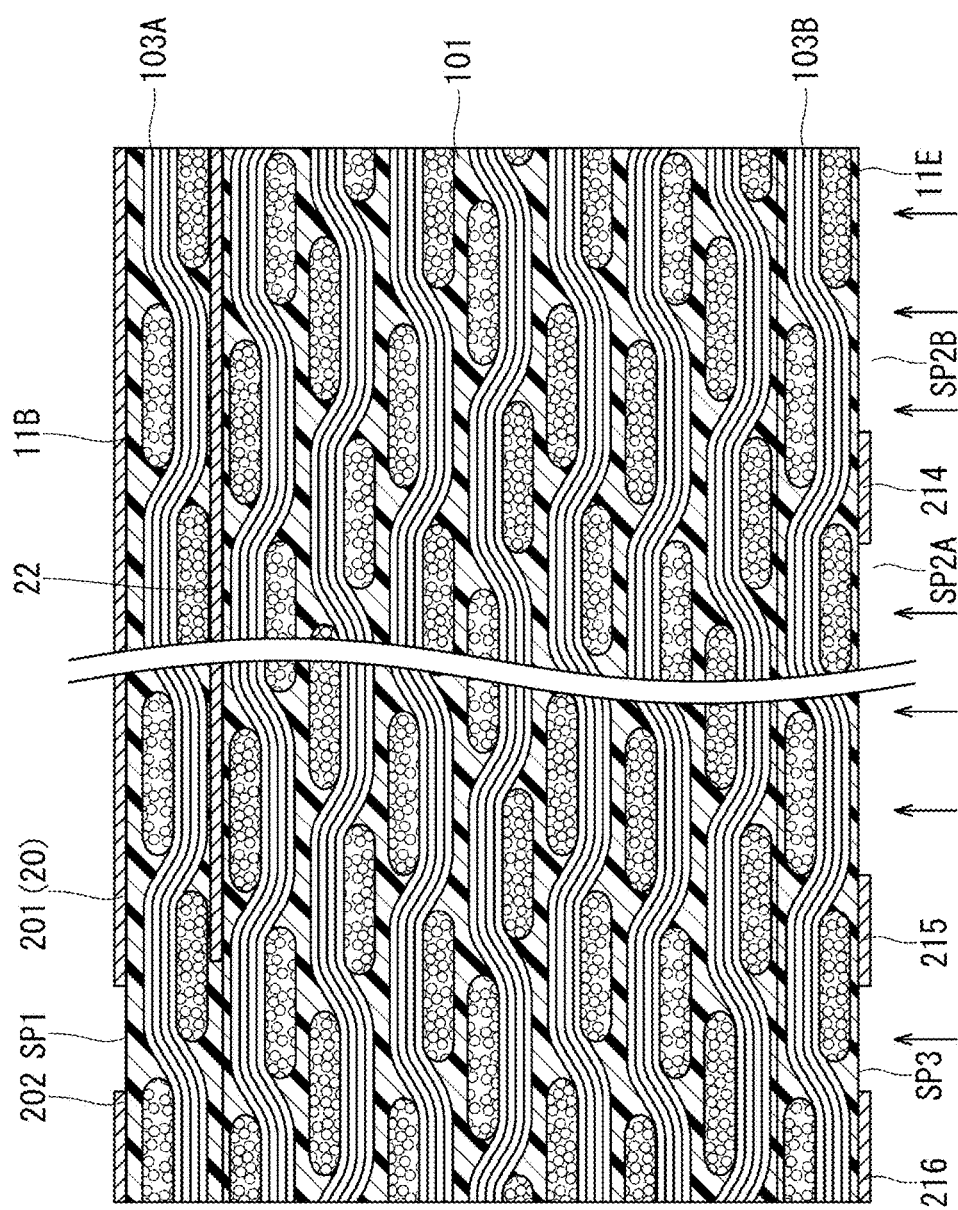
FIG. 8 is a cross-sectional view illustrating a manufacturing process of the shield cap.
Figure 10A:
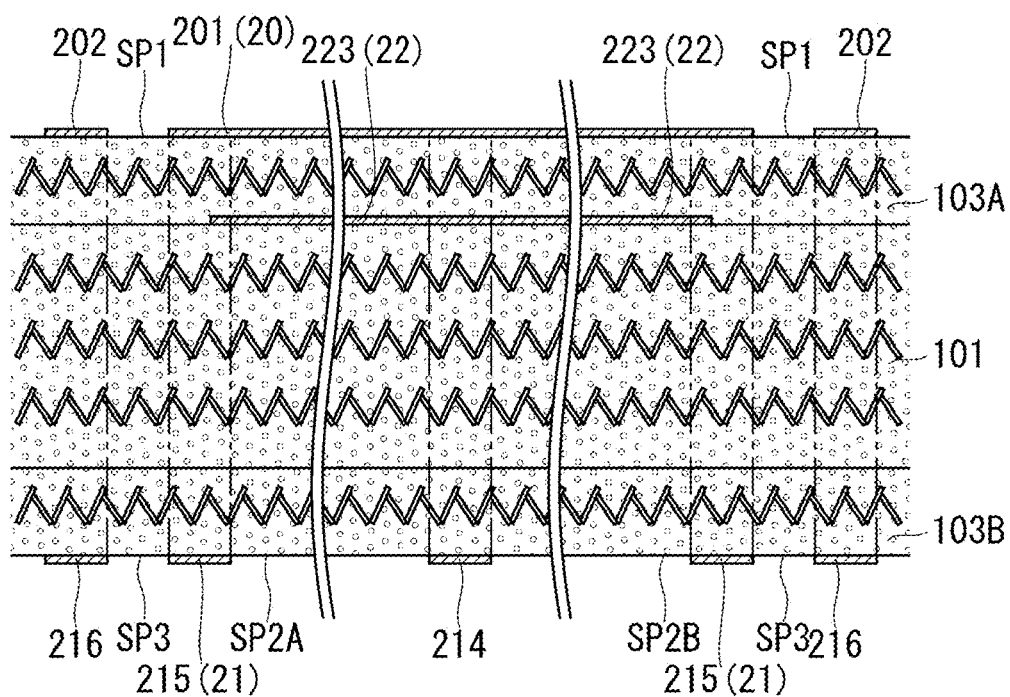
FIG. 10A illustrates positional relationships of conductor parts.
Figure 10B:
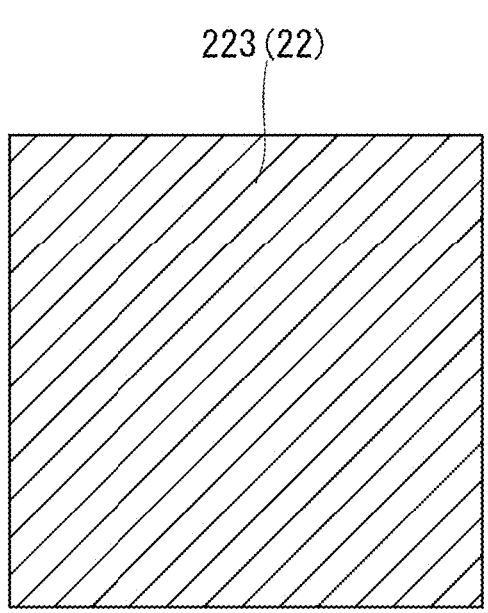
FIG. 10B is a plan view of a conductor part.

(4) Next, as illustrated in FIG. 8, a first conductor part 201 and a second conductor part 202 are formed on the second surface (11B) from the copper foil (104A) using a subtractive method. Further, as illustrated in FIG. 8, a fourth conductor part 214, a fifth conductor part 215 and a sixth conductor part 216 are formed on the fourth surface (11E) from the copper foil (104B) using a subtractive method. FIG. 11B illustrates planar shapes of the first conductor part 201 and the second conductor part 202, which are formed on the second surface (11B). For example, the first conductor part 201 is a quadrangle, and is surrounded by the second conductor part 202. There is a space (SP1) between the first conductor part 201 and the second conductor part 202. The first conductor part 201 and the ceiling part 12 have substantially the same shape. The first conductor part 201 corresponds to the second metal layer 20. FIG. 10B illustrates a planar shape of the first metal layer 22. The first metal layer 22 includes, for example, quadrangular third conductor part 223. FIG. 11A illustrates planar shapes of the fourth conductor part 214, the fifth conductor part 215 and the sixth conductor part 216, which are formed on the fourth surface (11E). For example, the fourth conductor part 214 has a rectangular shape, and the fifth conductor part 215 has a frame shape. The fourth conductor part 214 and the fifth conductor part 215 correspond to the third metal layer 21. As illustrated in FIG. 11A, the fourth conductor part 214 extends from one side to another side of the fifth conductor part 215. Due to the fourth conductor part 214, a region surrounded by the fifth conductor part 215 is divided into two regions. Due to the fourth conductor part 214 and the fifth conductor part 215, a space (SP2A) (space on a left side in FIG. 11A) and a space (SP2B) (space on a right side in FIG. 11A) are formed. There is a space (SP3) between the fifth conductor part 215 and the sixth conductor part 216. The first space (R1) is formed from the space (SP2A), and the second space (R2) is formed from the space (SP2B). FIG. 10A schematically illustrates positional relationships of the conductor parts (201, 202, 223, 214, 215, 216). As illustrated in FIG. 10A, when the fourth conductor part 214 and the fifth conductor part 215 are projected on the third surface (11D) with light perpendicular to the third surface (11D), the fourth conductor part 214 overlaps the third conductor part 223. Further, the fifth conductor part 215 partially overlaps the third conductor part 223. The spaces (SP2A, SP2B) between the fourth conductor part 214 and the fifth conductor part 215 overlap the third conductor part 223. That is, the third conductor part 223 is positioned above the spaces (SP2A, SP2B) and completely covers the spaces (SP2A, SP2B). An outer peripheral portion of the third conductor part 223 is positioned above the fifth conductor part 215. As illustrated in FIG. 10A, when the space (SP3) between the fifth conductor part 215 and the sixth conductor part 216 is projected on the second surface (11B) with light perpendicular to the second surface (11B), the space (SP3)

and the space (SP1) between the first conductor part 201 and the second conductor part 202 substantially overlap each other. FIG. 10A is a simplified cross-sectional view.

Figure 9:
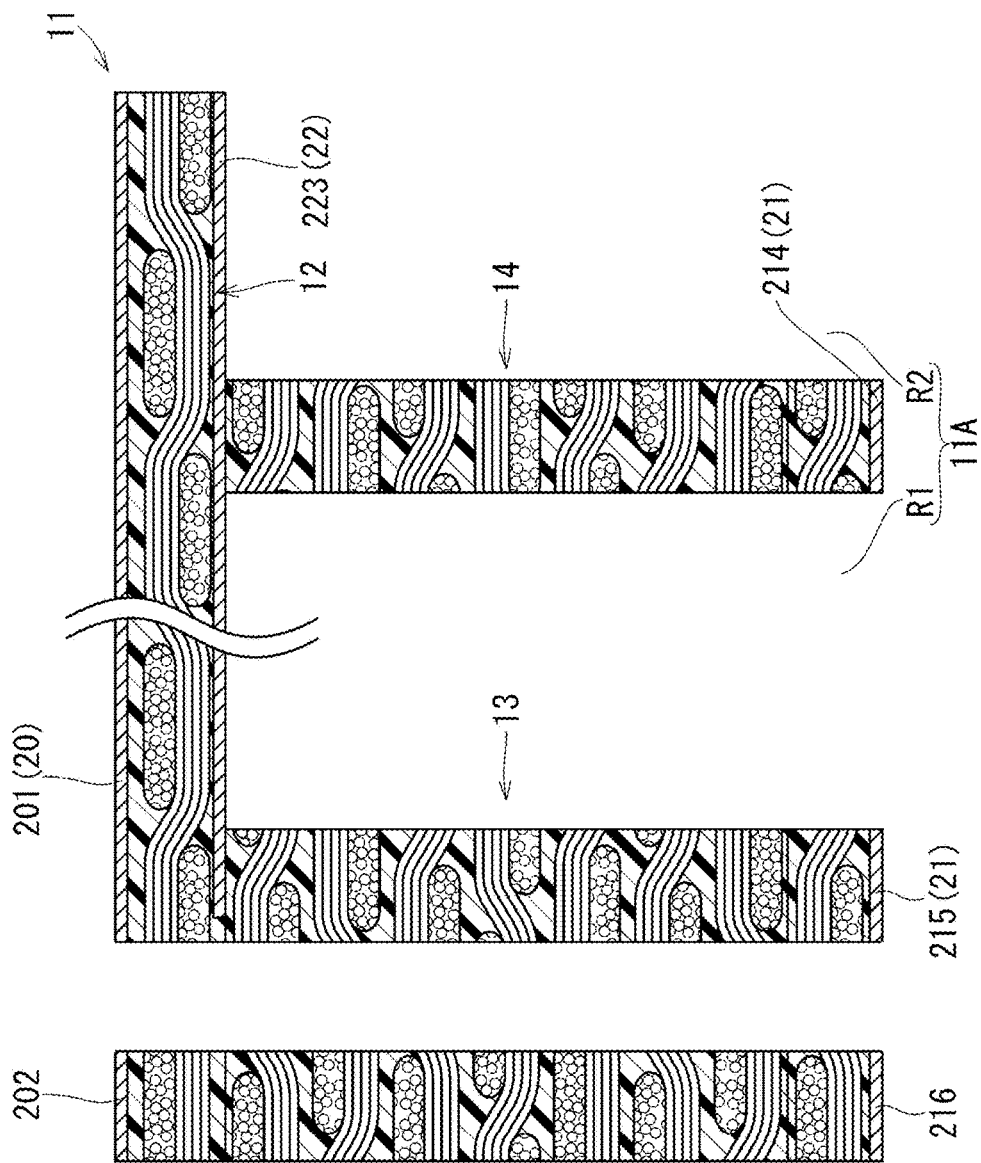
FIG. 9 is a cross-sectional view illustrating a manufacturing process of the shield cap.

(5) Next, the laminate is subjected to blasting from a direction of arrows illustrated in FIG. 8. As a result, as illustrated in FIG. 9, the third insulating layer (103B) and the first insulating layer 101 are removed. The first metal layer 22 is exposed. The partition wall 14, the first space (R1) and the second space (R2) are formed. Further, at the same time, of the first insulating layer 101, the second insulating layer (103A) and the third insulating layer (103B), portions sandwiched by the space (SP3) and the space (SP1) are removed. The laminate is cut. The side wall part 13 and the ceiling part 12 are formed. As a result, one cap member 11 is obtained. In this case, the fourth conductor part 214, the fifth conductor part 215 and the sixth conductor part 216 are used as a mask. The third conductor part 223 is used as a stopper. As a result, as illustrated in FIG. 9, of the insulating layers (103B, 101, 103A), portions exposed from the conductor parts (214, 215, 216) are removed. On the other hand, of the insulating layers (103B, 101, 103A), portions covered by the conductor parts (214, 215, 216) are not removed. Further, the third conductor part 223 exists on the spaces (SP2A, SP2B). Therefore, the second insulating layer (103A) on the third conductor part 223 is not removed. On the other hand, since the third conductor part 223 does not exist on the space (SP3), the second insulating layer (103A) is also removed. Therefore, one cap member 11 is obtained from the laminate. Further, an etching resist for forming the fourth conductor part 214, the fifth conductor part 215 and the sixth conductor part 216 is preferably removed after blasting. As a result, since the fourth conductor part 214, the fifth conductor part 215 and the sixth conductor part 216 are protected by the etching resist, reduction in thickness of the fourth conductor part 214, the fifth conductor part 215 and the sixth conductor part 216 due to blasting. The blasting is, for example, wet blasting. It is also possible that the laminate is cut using laser. In this case, laser is irradiated to the space (SP1). In the first embodiment, the cutting of the laminate is performed by blasting. Therefore, the formation of the spaces (R1, R2) and the cutting are simultaneously performed. The process is simplified.

(6) Next, an electroless plating treatment is performed, and the electroless plating film 31 is formed on the cap member 11. Next, an electrolytic plating treatment is performed, and the electrolytic plating film 32 is formed on the cap member 11. The conductive film 30 that is formed from the electroless plating film 31 and the electrolytic plating film 32 on the electroless plating film 31 covers the cap member 11. The shield cap 10 illustrated in FIG. 1 is completed.

The cap member 11 is manufactured by removing a portion of the laminate. Therefore, according to the manufacturing method of the first embodiment, a mold used in an injection molding method or a press molding method is unnecessary. As a result, a high mold cost can be suppressed. The manufacturing cost can be reduced. The manufacturing process is simplified. In FIG. 8, a region between the first conductor part 201 and the second conductor part 202 is used as the space (SP1). However, the second conductor part 202 can be removed. In this case, for example, a region between the second metal layer 20 and the second metal layer 20 of adjacent cap members 11, 11 can be used as the space (SP1). Further, the space (SP3) between the fifth conductor part 215 and the sixth conductor part 216 can be removed. A region between the fifth conductor part 215 and the fifth conductor part 215 of adjacent cap member 11, 11 can be used as the space (SP3).

In the first embodiment, the shield cap 10 contains the resin 17. The cap member 11 containing the resin 17 is a main part of the shield cap 10. When the main part of the shield cap 10 is formed of a metal, the weight of the shield cap is likely to increase. In contrast, in the first embodiment, the weight of the shield cap 10 can be reduced. Further, in the first embodiment, since the shield cap 10 contains the reinforcing material, the ceiling part 12 has high strength. Therefore, deformation of the ceiling part 12 can be suppressed. The thickness of the ceiling part 12 can be reduced. As a result, the weight of the shield cap 10 can be further reduced. Further, since the shield cap 10 has the partition wall 14, deformation of the ceiling part 12 can be suppressed. The thickness of the ceiling part 12 can be reduced. As a result, the weight of the shield cap 10 can be reduced.

Figure 12A:
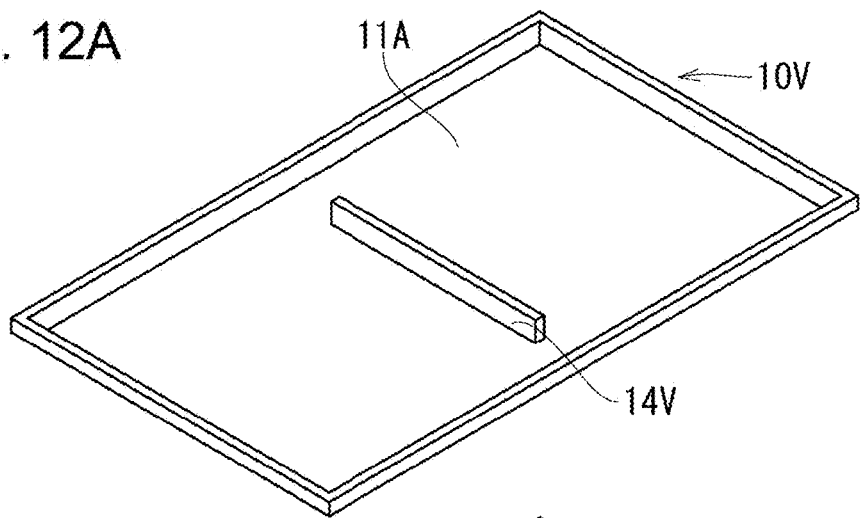
FIG. 12A-12C illustrate modified embodiments of shield caps.
Figure 12B:
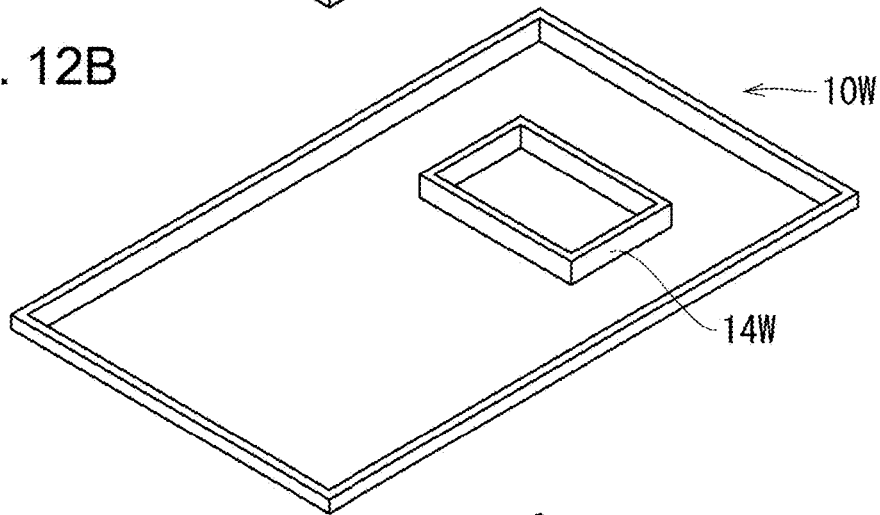
Figure 12C:
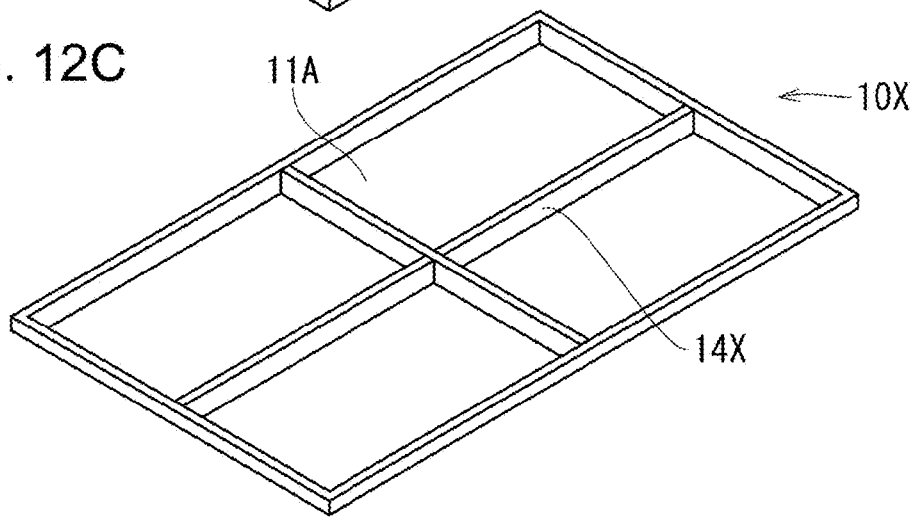

The shape of the partition wall 14 is not limited to that in the first embodiment. For example, as illustrated in FIG. 12A, it is also possible that the space (11A) is not completely separated by a partition wall (14V). Further, as illustrated in FIG. 12B, it is also possible that a partition wall (14W) has a frame shape. As illustrated in FIG. 12C, it is also possible that the space (11A) is divided in to three or more spaces by partition walls (14X). Here, the pace (11A) is a space formed by the side wall part 13 and the ceiling part 12.

According to Japanese Patent Laid-Open Publication No. 2002-237542, the metal foil tape has a thickness of 0.1 mm, and the polyamide imide has a thickness of 10 µm. Therefore, the ceiling part of the metal cap of Japanese Patent Laid-Open Publication No. 2002-237542 is likely to be easily deformed.

A shield cap for protecting an electronic component according to an embodiment of the present invention includes a cap member and a conductive film formed on the cap member, the cap member being formed by a ceiling part, a side wall part and a partition wall, the ceiling part being formed by an inner region and an outer region surrounding the inner region, the side wall part supporting the outer region, and the partition wall supporting the inner region. The ceiling part has a first surface facing the side wall part and the partition wall, and a second surface on an opposite side of the first surface, and has a reinforcing material between the first surface and the second surface. The electronic component is accommodated in a space formed by the ceiling part, the side wall part and the partition wall.

A method for manufacturing a shield cap for protecting an electronic component according to another embodiment of the present invention includes: preparing a first prepreg for forming a ceiling part that has a first surface; preparing a second prepreg for forming a side wall part and a partition wall, the side wall part and the partition wall having a third surface; forming a laminate by laminating the first prepreg on the second prepreg such that the first surface and the third surface face each other; forming a cap member from the side wall part, the partition wall and the ceiling part by forming a space for accommodating the electronic component in the laminate; and forming a conductive film on the cap member. The ceiling part has a reinforcing material.

Obviously, numerous modifications and variations of the present invention are possible in light of the above teachings. It is therefore to be understood that within the scope of the appended claims, the invention may be practiced otherwise than as specifically described herein.

The invention claimed is:
1. A shield cap for protecting an electronic component, comprising:

a cap member having a ceiling portion, a side wall portion and a partition wall portion;
a first metal layer formed on the ceiling portion of the cap member; and
a conductive film formed on the cap member such that the conductive film is configured to shield electromagnetic waves,
wherein the cap member is formed such that the ceiling portion has an inner region and an outer region surrounding the inner region, the side wall portion is supporting the outer region of the ceiling portion, and the partition wall portion is supporting the inner region of the ceiling portion, the ceiling portion has a first surface facing the side wall portion and the partition portion and a second surface on an opposite side with respect to the first surface and comprises a reinforcing material positioned between the first surface and the second surface, the cap member is formed such that the side wall portion, the ceiling portion and the partition wall portion are forming a plurality of accommodation spaces configured to accommodate a plurality of electronic components respectively, and the first metal layer is formed on the first surface of the ceiling portion such that the first metal layer is covering the plurality of accommodation spaces.

2. A shield cap for protecting an electronic component according to claim 1, wherein the partition wall portion is formed such that the plurality of accommodation spaces includes a first accommodation space and a second accommodation space separated by the partition wall portion.

3. A shield cap for protecting an electronic component according to claim 2, wherein the partition wall portion is formed such that the partition wall portion is connecting two opposing sides of the side wall portion.

4. A shield cap for protecting an electronic component according to claim 2, wherein each of the ceiling portion, the side wall portion and the partition wall portion comprises a resin material and a reinforcing material.

5. A shield cap for protecting an electronic component according to claim 2, further comprising:
a metal layer formed on a portion of the partition wall portion and a portion of the side wall portion,
wherein each of the partition wall portion and the side wall portion has a third surface facing the ceiling portion and a fourth surface on an opposite side with respect to the third surface, and the metal layer is formed on the fourth surface of each of the partition wall portion and the side wall portion.

6. A shield cap for protecting an electronic component according to claim 5, wherein the partition wall portion is formed such that the partition wall portion is connecting two opposing sides of the side wall portion.

7. A shield cap for protecting an electronic component according to claim 1, wherein the partition wall portion is formed such that the partition wall portion is connecting two opposing sides of the side wall portion.

8. A shield cap for protecting an electronic component according to claim 7, wherein each of the ceiling portion, the side wall portion and the partition wall portion comprises a resin material and a reinforcing material.

9. A shield cap for protecting an electronic component according to claim 5, wherein the partition wall portion is formed such that the plurality of accommodation spaces includes a first accommodation space and a second accommodation space separated by the partition wall portion.

10. A shield cap for protecting an electronic component according to claim 7, further comprising:
a metal layer formed on a portion of the partition wall portion and a portion of the side wall portion,
wherein each of the partition wall portion and the side wall portion has a third surface facing the ceiling portion and a fourth surface on an opposite side with respect to the third surface, and the metal layer is formed on the fourth surface of each of the partition wall portion and the side wall portion.

11. A shield cap for protecting an electronic component according to claim 1, wherein the ceiling portion comprises a resin material and the reinforcing material, and each of the side wall portion and the partition wall portion comprises a resin material and a reinforcing material.

12. A shield cap for protecting an electronic component according to claim 1, further comprising:
a metal layer formed on a portion of the partition wall portion and a portion of the side wall portion,
wherein each of the partition wall portion and the side wall portion has a third surface facing the ceiling portion and a fourth surface on an opposite side with respect to the third surface, and the metal layer is formed on the fourth surface of each of the partition wall portion and the side wall portion.

13. A shield cap for protecting an electronic component, comprising:
a cap member having a ceiling portion, a side wall portion and a partition wall portion;
a metal layer formed on a portion of the partition wall portion and a portion of the side wall portion; and
a conductive film formed on the cap member such that the conductive film is configured to shield electromagnetic waves,
wherein the cap member is formed such that the ceiling portion has an inner region and an outer region surrounding the inner region, the side wall portion is supporting the outer region of the ceiling portion, and the partition wall portion is supporting the inner region of the ceiling portion, the ceiling portion has a first surface facing the side wall portion and the partition portion and a second surface on an opposite side with respect to the first surface and comprises a reinforcing material positioned between the first surface and the second surface, the cap member is formed such that the side wall portion, the ceiling portion and the partition wall portion are forming a plurality of accommodation spaces configured to accommodate a plurality of electronic components respectively, each of the partition wall portion and the side wall portion has a third surface facing the ceiling portion and a fourth surface on an opposite side with respect to the third surface, and the metal layer is formed on the fourth surface of each of the partition wall portion and the side wall portion.

14. A shield cap for protecting an electronic component according to claim 13, wherein the partition wall portion is formed such that the plurality of accommodation spaces includes a first accommodation space and a second accommodation space separated by the partition wall portion.

15. A shield cap for protecting an electronic component according to claim 14, wherein the partition wall portion is formed such that the partition wall portion is connecting two opposing sides of the side wall portion.

16. A shield cap for protecting an electronic component according to claim 15, wherein the ceiling portion comprises a resin material and the reinforcing material, and each of the side wall portion and the partition wall portion comprises a resin material and a reinforcing material.

17. A shield cap for protecting an electronic component according to claim 14, wherein the ceiling portion comprises a resin material and the reinforcing material, and each of the side wall portion and the partition wall portion comprises a resin material and a reinforcing material.

18. A shield cap for protecting an electronic component according to claim 13, wherein the partition wall portion is formed such that the partition wall portion is connecting two opposing sides of the side wall portion.

19. A shield cap for protecting an electronic component according to claim 18, wherein the ceiling portion comprises a resin material and the reinforcing material, and each of the side wall portion and the partition wall portion comprises a resin material and a reinforcing material.

20. A shield cap for protecting an electronic component according to claim 13, wherein the ceiling portion comprises a resin material and the reinforcing material, and each of the side wall portion and the partition wall portion comprises a resin material and a reinforcing material.

* * * * *